United States Patent
Burke et al.

(10) Patent No.: US 11,839,031 B2
(45) Date of Patent: Dec. 5, 2023

(54) MICRO SOLDER JOINT AND STENCIL APERTURE DESIGN

(71) Applicant: Western Digital Technologies, Inc., San Jose, CA (US)

(72) Inventors: John Patrick Burke, San Jose, CA (US); Ibrahym bin Ahmad, Parit Buntar (MY); Fakhrozi Bin Che Ani, Bukit Mertajam (MY); Mohamad Solehin Bin Mohamed Sunar, Bagan Serai (MY); Peir Ming Sing, Bukit Mertajam (MY); Hari Kiran Raavi, Dublin, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 0 days.

(21) Appl. No.: 17/714,837

(22) Filed: Apr. 6, 2022

(65) Prior Publication Data

US 2023/0328892 A1  Oct. 12, 2023

(51) Int. Cl.
| | | |
|---|---|---|
| H05K 3/34 | (2006.01) | |
| H05K 3/12 | (2006.01) | |
| B23K 1/00 | (2006.01) | |
| B23K 3/06 | (2006.01) | |
| B23K 101/42 | (2006.01) | |
| B23K 103/12 | (2006.01) | |

(52) U.S. Cl.
CPC ......... *H05K 3/1225* (2013.01); *B23K 1/0008* (2013.01); *B23K 3/0623* (2013.01); *H05K 3/1233* (2013.01); *H05K 3/3485* (2020.08); *B23K 2101/42* (2018.08); *B23K 2103/12* (2018.08)

(58) Field of Classification Search
CPC ............ B23K 2103/12; B23K 2103/42; B23K 1/0008; B23K 3/0623; H05K 2103/12; H05K 3/1233; H05K 3/1225
See application file for complete search history.

(56) References Cited

U.S. PATENT DOCUMENTS

| 5,743,007 A | 4/1998 | Onishi et al. |
| 2001/0011676 A1 | 8/2001 | Regner et al. |

(Continued)

FOREIGN PATENT DOCUMENTS

| CA | 2278019 A1 * | 7/1998 | |
| JP | H06232544 A | 8/1994 | |

(Continued)

*Primary Examiner* — Christopher E Mahoney
*Assistant Examiner* — Marissa Ferguson-Samreth
(74) *Attorney, Agent, or Firm* — Michael Best & Friedrich LLP (57) ABSTRACT

Micro solder joint and stencil design. In one embodiment, a stencil for depositing solder on a printed circuit board (PCB) includes a plurality of stencil apertures, a first stencil aperture of the plurality of apertures having an aperture wall defining an aperture perimeter. The aperture wall is configured to not extend beyond an outer edge of a PCB pad provided on the printed circuit board, the aperture wall is also configured to not extend beyond an outer edge of a terminal of a surface mount component, and the first stencil aperture is configured to receive solder paste to form a non-convex solder joint between the PCB pad and the terminal.

9 Claims, 11 Drawing Sheets

(56) References Cited

U.S. PATENT DOCUMENTS

2008/0083816 A1* 4/2008 Leinbach ............. H05K 3/1233
228/8
2013/0206456 A1   8/2013 Ootani et al.
2021/0315107 A1* 10/2021 Vasudevan ........... B23K 1/0016

FOREIGN PATENT DOCUMENTS

JP            H10154870 A    6/1998
WO          WO-9620580 A1 *  7/1996   ........... H05K 3/3442

* cited by examiner

| Lead | PCB Pad | Stencil Opening | Radio PCB Pad: Stencil Aperture | Radio Component Termination: Stencil Aperture | Area Ratio | Theoretical Volume ($mm^3$) |
|---|---|---|---|---|---|---|
| 1 | 0.2mm x 0.8mm | 0.17mm x 0.84mm | 1:0.89 | 1:1.428 | 0.71 | 0.0143 |
| 2 | 0.2mm x 1mm | 0.17mm x 1.14mm | 1:0.97 | 1:1.21 | 0.737 | 0.0194 |
| 3 | 0.25mm x 1mm | 0.18mm x 1.14mm | 1:0.82 | 1:1.03 | 0.796 | 0.0206 |
| 4 | 0.2mm x 1.7mm | 0.17mm x 1.75mm | 1:0.87 | 1:1.06 | 0.766 | 0.0298 |
| 5 | 0.25mm x 1.7mm | 0.18mm x 1.75mm | 1:0.74 | 1:0.9 | 0.83 | 0.0315 |

| Lead | New Opening (mm) | Area Ratio | Radio PCB Pad: Stencil Aperture | Radio Component Termination: Stencil Aperture | Theoretical Volume (mm³) |
|---|---|---|---|---|---|
| 1 | 0.58 x 0.2 | 0.77 | 1:0.725 | 1:1.2 | 0.0116 |
| 2 | 0.883 x 0.2 | 0.839 | 1:0.88 | 1:1.1 | 0.0177 |
| 3 | 0.883 x 0.2 | 0.839 | 1:0.71 | 1:0.8 | 0.0177 |
| 4 | 1.482 x 0.2 | 0.898 | 1:0.87 | 1:1.1 | 0.0297 |
| 5 | 1.482 x 0.2 | 0.898 | 1:0.7 | 1:0.85 | 0.0297 |

MICRO SOLDER JOINT AND STENCIL APERTURE DESIGN

FIELD

This application relates generally to a solder paste stencil and, more particularly, to a solder paste stencil with an aperture that has the same length as a surface-mount circuit component to provide a non-convex micro solder joint.

BACKGROUND

Figure 1:
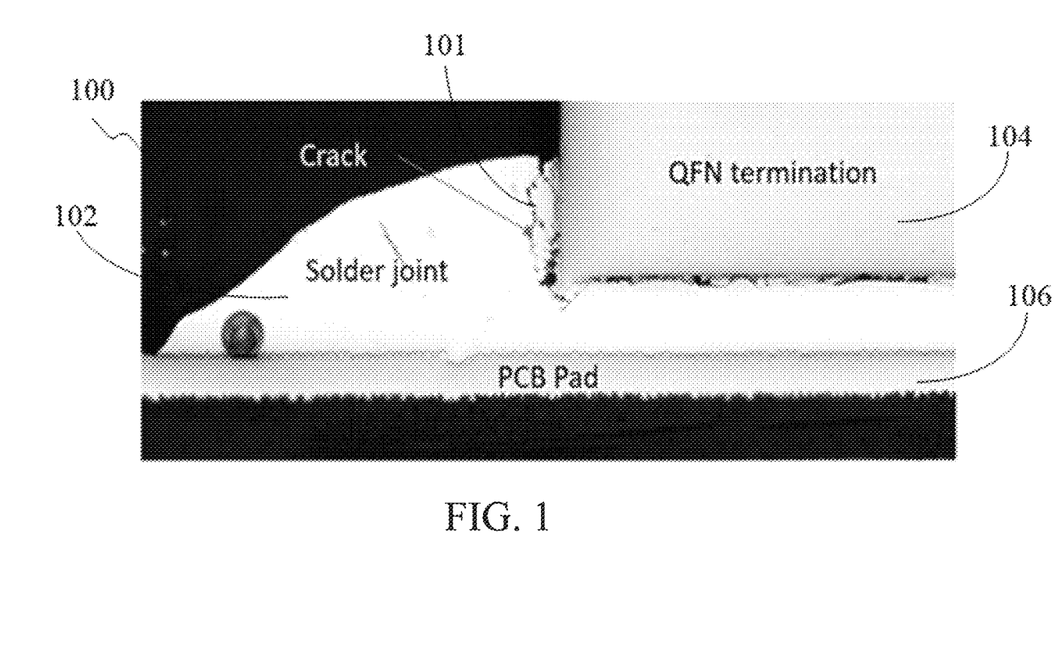
FIG. 1 is a crack formation image illustrating a crack in an example convex solder joint.

FIG. 1 is a crack formation image 100 illustrating a crack 101 in a convex solder joint 102. The reliability of solder joints is a common issue in the surface-mount technology (SMT) process, and in particular, in power management integrated circuits (PMIC), due to the miniaturization of the solder joints. As illustrated in FIG. 1, a terminal 104 of a quad-flat-no-lead (QFN) package is surface mounted to a printed circuit board (PCB) pad 106 via solder paste. Commonly, the solder paste contacts a non-solderable side surface of the terminal 104. During a reflow process, the solder is heated to form a bond between the QFN terminal 104 and the PCB pad 106.

During repeated thermal cycles, the crack 101 of the crack formation image 100 of FIG. 1 is formed due to thermal expansion and contraction. For example, the crack may be formed after 500 thermal cycles. The crack 101 formed at the interface of the convex solder joint 102 and QFN terminal 104 and propagated inward further along the interface and, in some cases, the crack my propagate along a surface of the terminal 104 that is parallel to and facing a surface of the PCB pad 106. The convex solder joint 102 may lead to excessive stress on the interface as well as reduction in performance.

Figure 2:
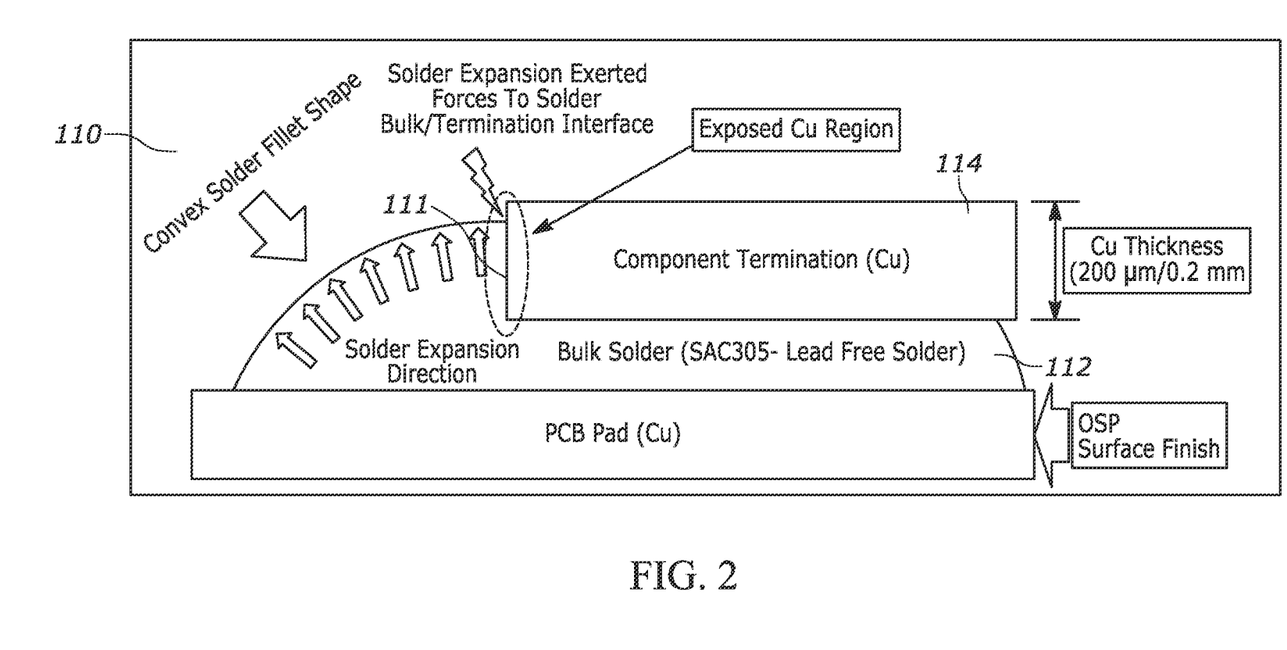
FIG. 2 is an image illustrating an example convex solder joint.

FIG. 2 is an image 110 illustrating another example of the convex solder joint 112. A side surface 111 of a QFN package and QFN terminals 114 is not plated with a tin (Sn) coating like a surface of the QFN package 114 that faces the PCB pad, thus a copper (Cu) region is exposed to the solder joint 112 during a reflow process. The side surface 111 may be prone to oxide formations as a result of oxidation during storage and shipment of the QFN package. The oxide formations may inhibit a metallurgical reaction during soldering, thus, promoting cracking of the convex solder joint 112. Additionally, during thermal cycles, the interface of the solder joint 112 and the terminal 114 may react with one another causing a brittle intermetallic compound (e.g., $Ni_3Sn$, $Ni_3Sn_2$, $Ni_3Sn_4$, $NiSn_3$, $Cu_6Sn_5$, $Cu_3Sn$) to be produced. The crack may then propagate due to the expansion direction of the convex shape of the solder joint 112, thus, causing a disruption in the electrical functionality (i.e., a reduction in performance) of the QFN package. For example, the QFN package may be used as the main power input source on a circuit board. Consequently, a faulty connection may be a result of the crack forming and increasing on the convex solder joint 112.

SUMMARY

To overcome the crack from forming and propagating along an interface of the terminal of the QFN package and the solder joint, a solder paste stencil aperture that leads to a concave solder joint is needed to improve the performance of the solder joint, and therefore, the performance of the QFN package. A curvature of a solder filet influences the stress state of the solder joint. The curvature of the solder filet may be controlled by parameters such as dimensions of a stencil aperture and application of solder paste to a surface of the terminal that faces the PCB pad, and not to a side surface of the terminal. It is advantageous to provide a stencil aperture with dimensions that ensures a concave solder filet (instead of the typical convex solder filet), which in turn, provides a minimized stress concentration, thus, providing an increase in performance of the QFN package. The stencil aperture of the present disclosure may lead to a reduction in cost because the performance of the QFN package is increased.

This disclosure provides a method of assembling an electronic device using a stencil. The method includes depositing a solder paste at a plurality of stencil apertures on a printed circuit board (PCB) pad, wherein the PCB pad has a first predefined area and one stencil aperture of the plurality of stencil apertures has an aperture wall defining a second predefined area that is less than or equal to the first predefined area. The method further includes providing a surface mount circuit component on top of the solder paste, wherein the surface mount circuit component includes at least one terminal with a non-solderable side surface. The method also includes performing a reflow process to form a non-convex solder joint between the at least one terminal and the PCB pad.

Further, this disclosure provides a stencil for depositing solder on a printed circuit board (PCB). The stencil includes a plurality of stencil apertures, a first stencil aperture of the plurality of apertures having an aperture wall defining an aperture perimeter. The aperture wall is configured to not extend beyond an outer edge of a PCB pad provided on the printed circuit board, the aperture wall is configured to not extend beyond an outer edge of a terminal of a surface mount component, and the first stencil aperture is configured to receive solder paste to form a non-convex solder joint between the PCB pad and the terminal.

Further, this disclosure provides an electronic device assembled using a stencil. The electronic device includes a printed circuit board (PCB) including a substrate defining a plurality of PCB pads with a first predefined area, a surface mount circuit component including at least one terminal, and a non-convex solder joint between the at least one terminal and one of the plurality of PCB pads.

In this manner, various aspects of the disclosure provide for improvements in at least the technical fields of solder paste stencils and assembling with solder paste stencils. The foregoing introduction is intended solely to give a general idea of various aspects of the disclosure and does not limit the scope of the disclosure in any way.

DETAILED DESCRIPTION

Figure 3:
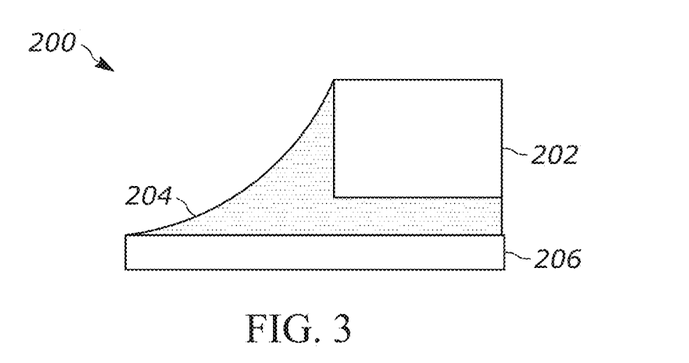
FIG. 3 is a schematic diagram illustrating a cross-section of a concave solder joint.

FIG. 3 is a schematic diagram illustrating a cross-section 200 of a concave solder joint 204. The concave solder joint 204 solders a terminal 202 of a surface-mount circuit component to a PCB board 206. The concave solder joint 204 includes a solder alloy (e.g., SnAgCu). The terminal 202 of the component that contacts the solder, thus creating the concave solder joint 204, may be comprised of copper (Cu). Copper may be prone to severe oxidation, leading to poor solder wetting and, thus, solder defects when the solder joint is a higher-stress shape (i.e., a convex shape) relative to a low stress shape (i.e., a non-convex shape). The PCB board 206 may include a copper substrate. The concave solder joint 204 is one example of the lower-stress shape because the concave solder joint 204 is a non-convex shape.

The solder alloy and the terminal 202 may have different coefficients of thermal expansion (CTE) from one another. For example, the CTE of SnAgCu is 21 parts per million per degrees (Celsius) (ppm/° C.) and the CTE of Cu is 17 ppm/° C. The differing CTE between the solder alloy and the terminal 202 leads the expansion and contraction at differing rates during thermal cycles, thus producing principal stress on the concave solder joint 204. In some embodiments, thermal cycles is designed to impose defects to the surface-mount circuit component.

For example, a surface-mount circuit component, and in particular solid-state devices (SSD), includes an approximate acceptance failure risk of 0.1%. The achievement of the concave shape of the concave solder joint 204 will be described below with respect to FIGS. 8 and 10.

Figure 4:
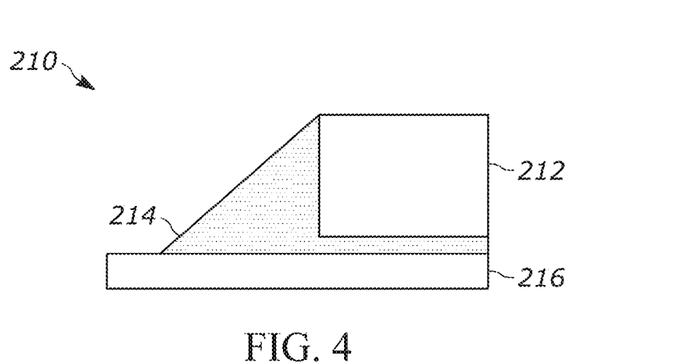
FIG. 4 is a schematic diagram illustrating a cross-section of a straight solder joint.

FIG. 4 is a schematic diagram illustrating a cross-section 210 of a straight solder joint 214. The straight solder joint 214 solders a terminal 212 of a surface-mount circuit component to a PCB board 216. The straight solder joint 214 may include a similar solder alloy as the concave solder joint 204 (FIG. 3). More importantly, the straight solder joint 214 is another example of the lower-stress shape because the straight solder joint 214 is a non-convex shape.

Figure 5:
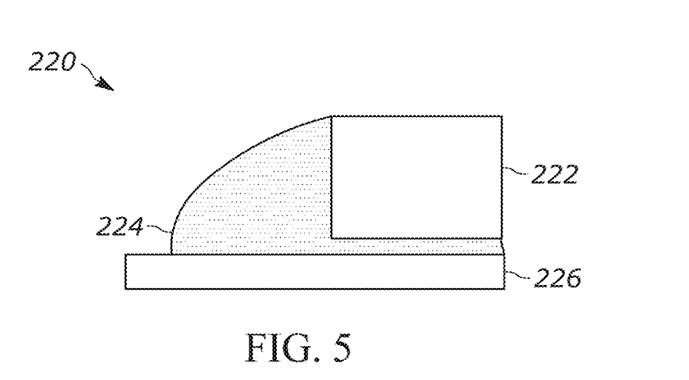
FIG. 5 is a schematic diagram illustrating a cross-section of a convex solder joint.

FIG. 5 is a schematic diagram illustrating a cross-section 220 of a convex solder joint 224, similar to the convex solder joint of FIGS. 1 and 2. The convex solder joint 224 solders a terminal 222 of a surface-mount circuit component to a PCB board 226. The convex solder joint 224 may include a similar solder alloy as concave solder joint 204 (FIG. 3). The convex solder joint 224 is an example of the higher-stress shape because the convex solder shoulder joint is a convex shape.

Figure 6:
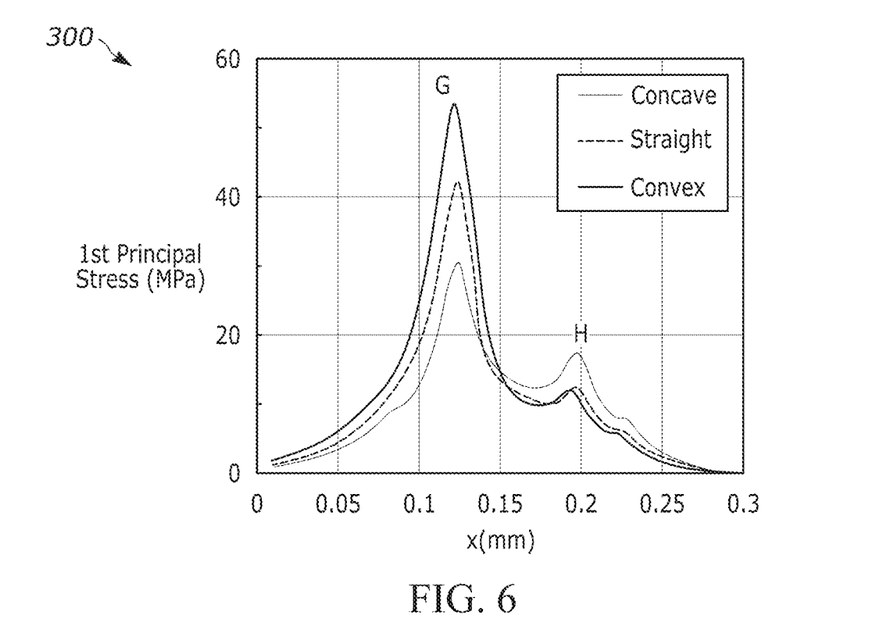
FIG. 6 is a graph illustrating a comparison of principal stress levels exerted by the solder joints of FIGS. 3-5.

FIG. 6 is a graph 300 illustrating a comparison of principal stress levels exerted by the concave solder joint 204, the straight solder joint 214, and the convex solder joint 224 with respect to the distance from the terminals 202, 212, 222 of the surface-mounted components. The curvature of the solder joint influences the stress state in the concave solder joint 204, the straight solder joint 214, and the convex solder joint 224.

As illustrated in the graph 300, the convex solder joint 224 produces the highest stress with a maximum stress level that is about 75% larger than that for the concave solder joint 204 at a location near the terminal 202, 222. The principal stress level exerted by the concave solder joint 204 may be at a maximum about 0.125 millimeters (mm) from the terminal 202. For example, the maximum value may be 30 mega-paschal (MPa). The principal stress level exerted by the concave solder joint 204 may once again peak at 0.2 mm from the terminal 202. As shown in the graph 300, the principal stress level exerted by the concave solder joint 204 may be greater than the principal stress level exerted by the convex solder joint 224 at 0.2 mm from the terminal 202, 222. Thus, the curvature of the solder joint may transfer the stress to a location that is further from the terminal such that cracking is minimized at the interface of the solder joint and the terminal.

The concave solder joint 204 may result in the least amount of stress relative to the straight solder joint 214 and the convex solder joint 224. However, both the concave solder joint 204 and the straight solder joint 214 are lower in overall stress than the convex solder joint 224.

Figure 7:
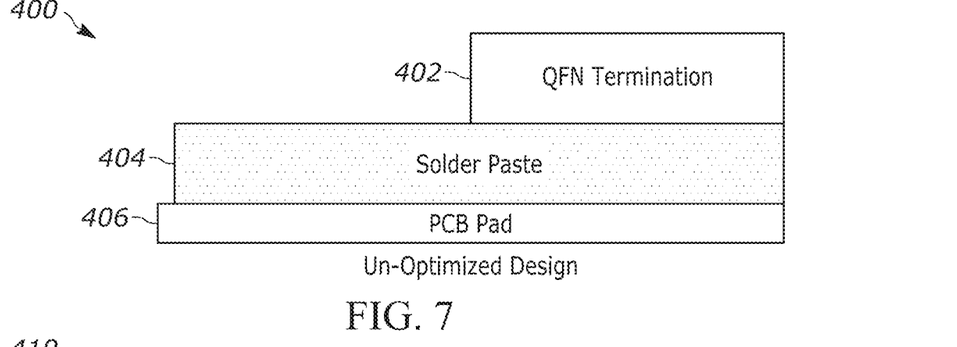
FIG. 7 is an image illustrating a cross-section of a higher-stress stencil aperture design.

FIG. 7 is an image illustrating a cross-section of a higher-stress stencil aperture design 400. The higher-stress stencil aperture design 400 includes a QFN terminal 402, solder paste 404, and a PCB pad 406. The solder paste 404 extends past the edge of the QFN terminal 402 by a first predetermined amount. In some embodiments, the higher-stress stencil aperture design 400 leads to a convex solder joint 224 when the reflow process takes place due to the solder past 404 expanding to contact the edge of the QFN terminal 402. In some embodiments, the higher-stress stencil aperture design 400 may include solder paste 404 that contacts the side edge of the QFN terminal 402.

Figure 8:
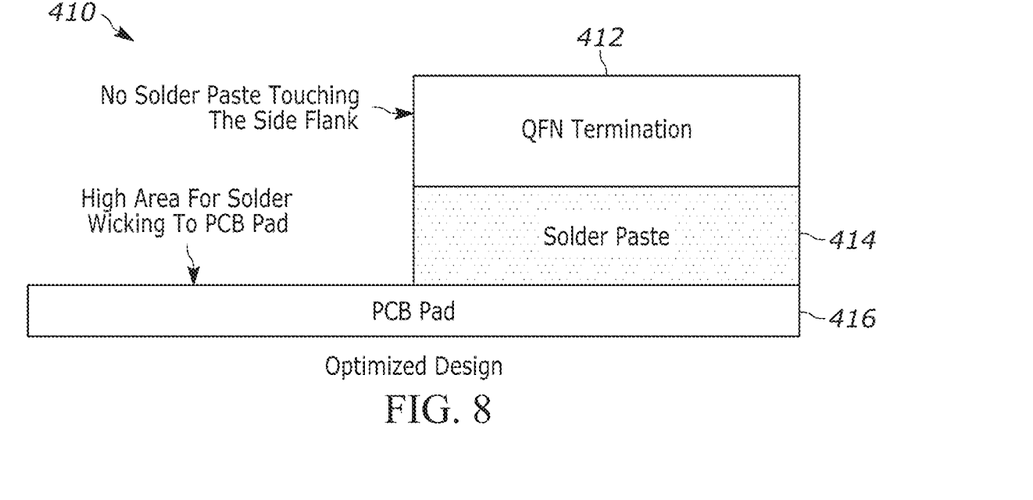
FIG. 8 is an image illustrating a cross-section of a lower-stress stencil aperture design.

FIG. 8 is an image illustrating a cross-section of a lower-stress stencil aperture design 410. The lower-stress stencil aperture design 410 includes a QFN terminal 412, solder paste 414, and a PCB pad 416. The solder paste 414 has the same length as the bottom of the QFN terminal 412. In some embodiments, a stencil is laid on the PCB pad 416. The stencil includes a plurality of stencil apertures. For example, a first stencil aperture of the plurality of stencil apertures has an aperture wall defining an aperture perimeter that has a first area. The first stencil aperture may receive the solder paste 414 and the solder paste 414 may have the same area as the first area.

In some embodiments, an edge of the solder paste 414 may be parallel to an edge of the QFN terminal 412 prior to the reflow process taking place due to the wall of the stencil aperture aligning with the edge of the QFN terminal 412. The edge of the solder paste 414 and the edge of the QFN terminal 412 combine to provide a single, combined side surface in a first direction prior to the reflow process. The lower-stress stencil aperture design 410 leads to a concave solder joint 204 when the reflow process takes place. The lower-stress stencil aperture design 410 does not include solder paste 414 contacting the side edge of the QFN terminal 412. The absence of solder paste 414 at the side edge of the QFN terminal 412 minimizes the risk of a solder joint cracking at the side edge of the QFN terminal 412, especially during thermal cycles.

Figure 9:
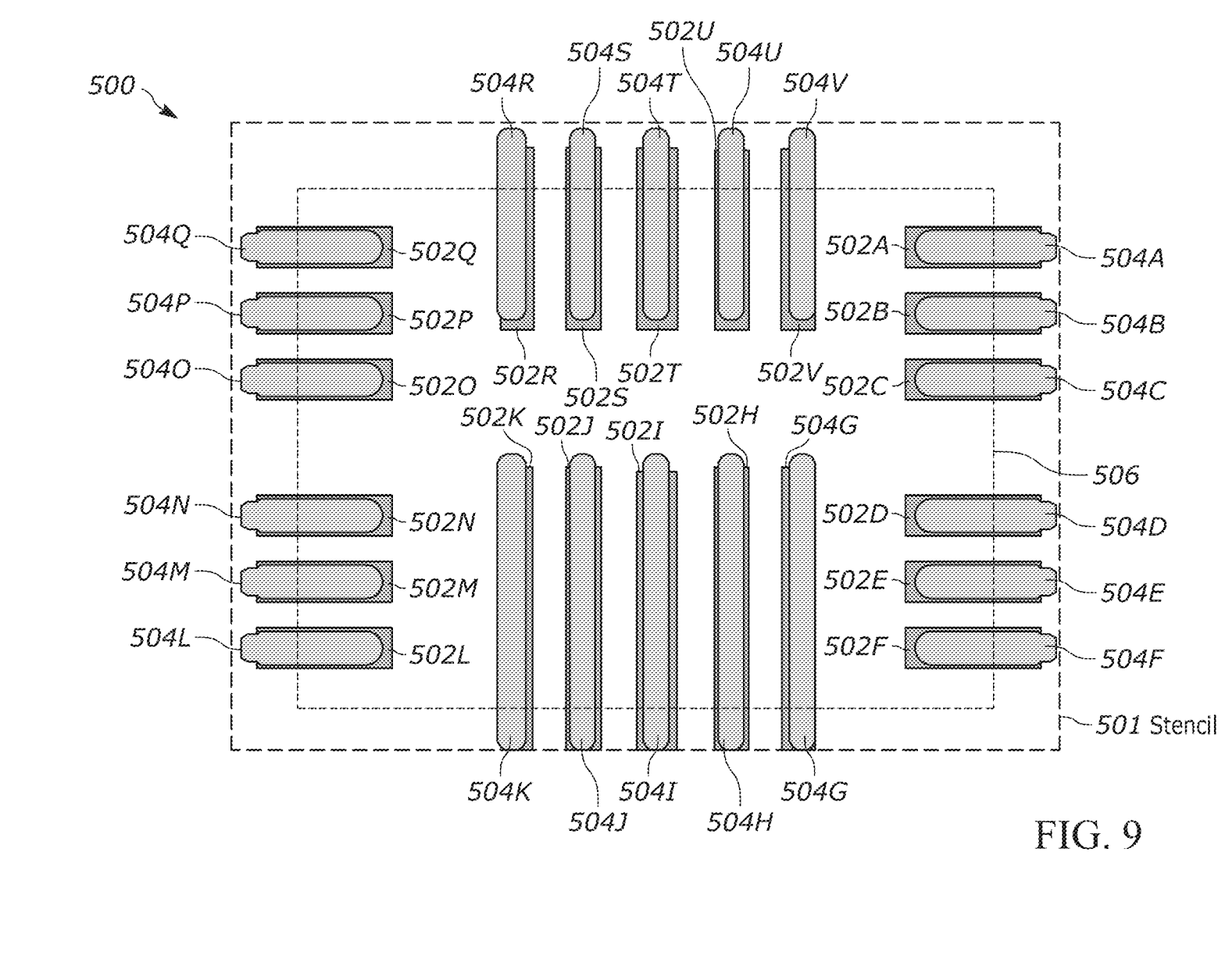
FIG. 9 is an image illustrating a higher-stress stencil aperture design.

FIG. 9 is an image illustrating a higher-stress stencil aperture design 500. The higher-stress stencil aperture design 500 includes a plurality of PCB pads 502 (individually PCB pads 502A-502N), a stencil 501 with a plurality of stencil apertures 504 (individually stencil apertures 504A-504N), and a component layout 506. In some embodiments, the higher-stress stencil aperture design 500 receives a surface-mount circuit component that includes terminals that are configured to be electrically connected to the plurality of PCB pads 502 via solder paste that is placed using the plurality of stencil apertures 504. For example, the surface-mount circuit component may be a QFN package. However, alternative surface-mount circuit component may be also contemplated. Accordingly, in some examples, the area of the PCB pad 502A and the area of the stencil aperture 504A are substantially the same in the higher-stress stencil aperture design 500. For example, during the reflow process, the solder paste is unable to wick due to the equivalent areas of the PCB pad 502A and the stencil aperture 504A that allows an equivalent area of solder paste to be laid on the PCB pad 502A.

Figure 10:
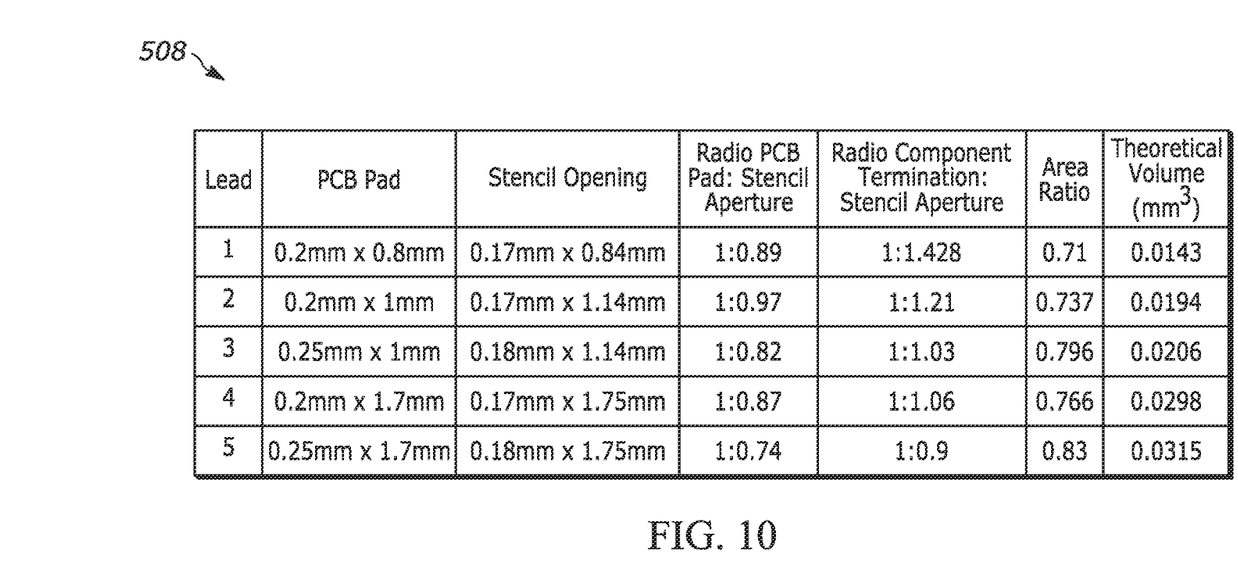
FIG. 10 is a table illustrating ratios of the higher-stress stencil aperture design of FIG. 9.

FIG. 10 is a table 508 illustrating ratios between the PCB pad 502 and the stencil aperture 504 and the component terminals and the stencil aperture 504 of the higher-stress stencil aperture design 500. For example, dimensions of the PCB pad 502 corresponding to a first lead may be 0.2 millimeters (mm) wide by 0.8 mm long and dimensions of the corresponding stencil aperture 504 may be 0.17 mm wide by 0.84 mm long. In the current example, the ratio of the PCB pad 502 to the stencil aperture 504 would be 1:0.89 and the ratio of the terminal of the surface-mount component to the stencil aperture 504 would be 1:1.428.

Figure 11:
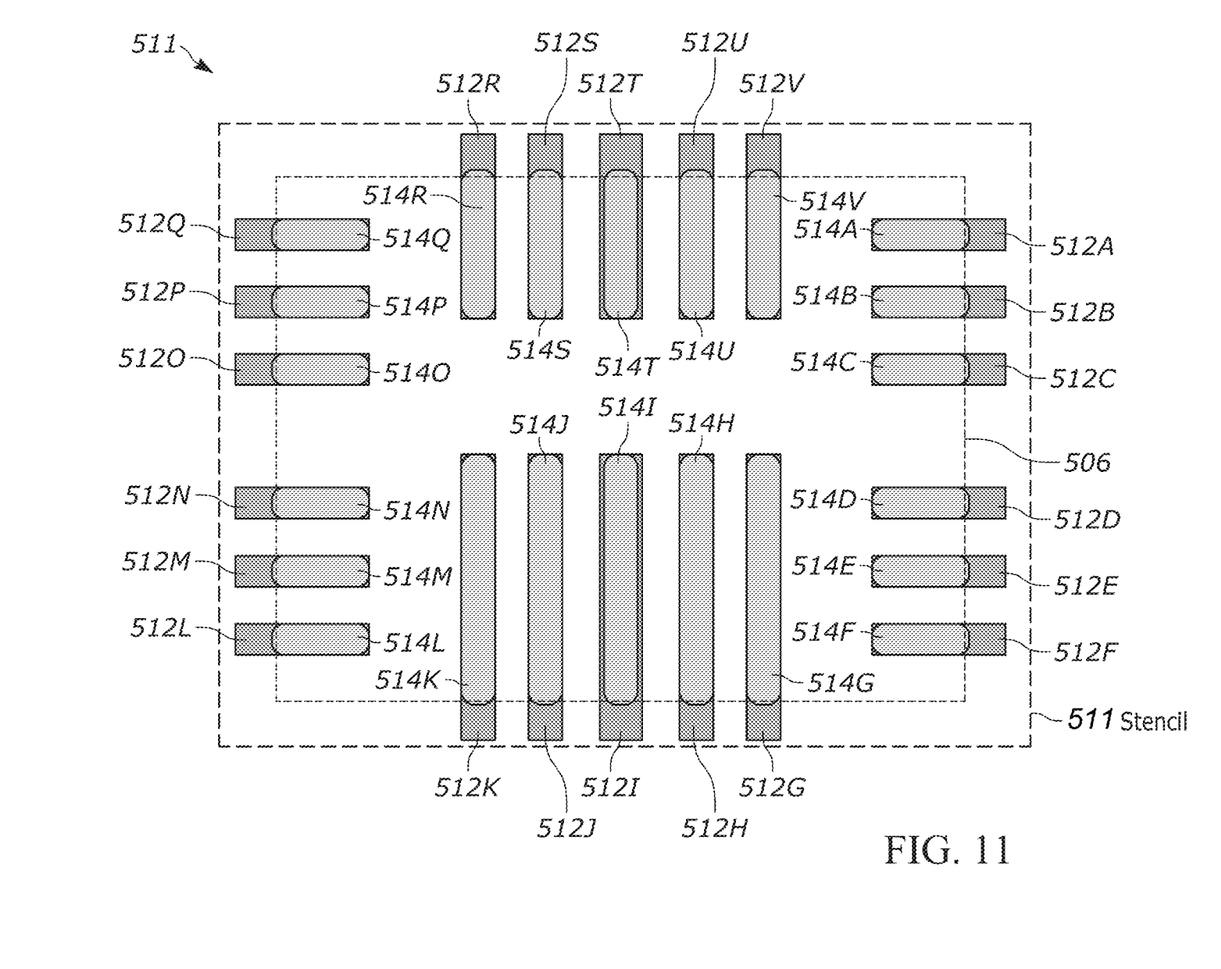
FIG. 11 is an image illustrating a lower-stress stencil aperture design.

FIG. 11 is an image illustrating a lower-stress stencil aperture design 510 that has lower-stresses relative to the higher-stress stencil aperture design 500. The lower-stress stencil aperture design 510 includes a plurality of PCB pads 512 (individually PCB pads 512A-512N), a stencil 511 with a plurality of stencil apertures 514 (individually, stencil apertures 514A-514N) and a component layout 516. In some embodiments, each of the plurality of stencil apertures 514 is formed by cutting a stencil using electroforming. In some embodiments, a first stencil aperture 514A of the plurality of stencil apertures 514 includes a rectangular aperture wall with a first lengthwise wall, a second lengthwise wall that is parallel to the first lengthwise wall, a first widthwise wall, and a second widthwise wall that is parallel to the first widthwise wall. Similar to the higher-stress stencil aperture design 500, in some embodiments, the lower-stress stencil aperture design 510 receives a surface-mount circuit component that includes terminals that are configured to be electrically connected to a first PCB pad 512A of the plurality of PCB pads 512 via solder paste that has an area corresponding to the first stencil aperture 514A. For example, solder paste may be deposited on the stencil such that the solder paste contacts the PCB pad 512A at the first stencil aperture 514A. In some embodiments, the first PCB pad 512A may be a first predetermined area comprised of copper (Cu). In some embodiments, the first stencil aperture 514A and the corresponding solder paste is a second predetermined area that is less than the first predetermined area. For example, the second predetermined area may be a 1:0.8 to 1:1.2 ratio of an area of the terminals of the surface-mount circuit component.

In some embodiments, the surface-mount circuit component may include various sized terminals. The first stencil aperture 514A and the corresponding solder paste of the lower-stress stencil aperture design 510 may correspond to the various sized terminals, such that the solder paste is the same area as the various sized terminals, and is less than the area of each of the plurality of PCB pads 512.

In some embodiments, the first stencil aperture 514A allows for an increased height of solder paste. The lower-stress stencil aperture design 510 significantly reduces the potential for cracking between the solder paste and the terminal during a reflow process by allowing the solder paste to wick when heated, thus, creating a concave solder joint.

Figure 12:
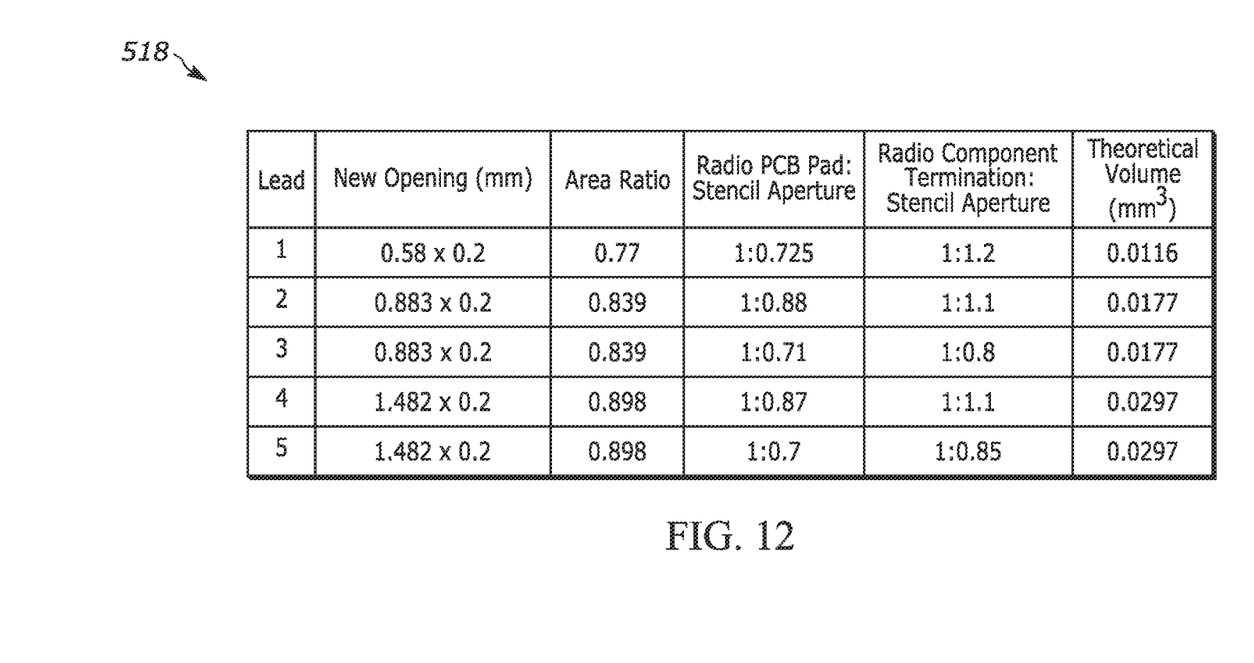
FIG. 12 is a table illustrating ratios of the lower-stress stencil aperture design of FIG. 11.

FIG. 12 is a table 518 illustrating ratios between the PCB pad 512 and the stencil aperture 514 and the component terminals and the stencil aperture 514 of the lower-stress stencil aperture design 510. For each corresponding lead of the higher-stress stencil aperture design 500, the leads of the lower-stress stencil aperture design 510 include a smaller ratio between both the PCB pad 512 and the stencil aperture 514 and the component terminals and the stencil aperture 514. This allows for the solder paste to wick during the reflow process, thus, creating a concave solder joint. For example, dimensions of the PCB pad 512 corresponding to a first lead may be 0.2 millimeters (mm) wide by 0.8 mm long and dimensions of the corresponding stencil aperture 514 may be 0.2 mm wide by 0.48 mm long. In the current example, the ratio of the PCB pad 512 to the stencil aperture 514 would be 1:0.725 and the ratio of the terminal of the surface-mount component to the stencil aperture 514 would be 1:1.2.

In some embodiments, the lower-stress stencil aperture design 510 may produce a reduction in volume of solder paste used compared to the higher-stress stencil aperture design 500. For example, the volume of solder used at each lead may be reduced between 1 and 15%. In the illustrated embodiment, the volume reduction of the first lead is 18.9%. Alternatively, in some embodiments, the volume of solder paste used may increase less than 1% compared to the higher-stress stencil aperture design 500. For example, the height of the solder paste and/or the width of the stencil aperture 514 may increase. The values in the table 518 are merely exemplary and may include any number of values that produce ratios that are less than the ratios of table 508.

Figure 13:
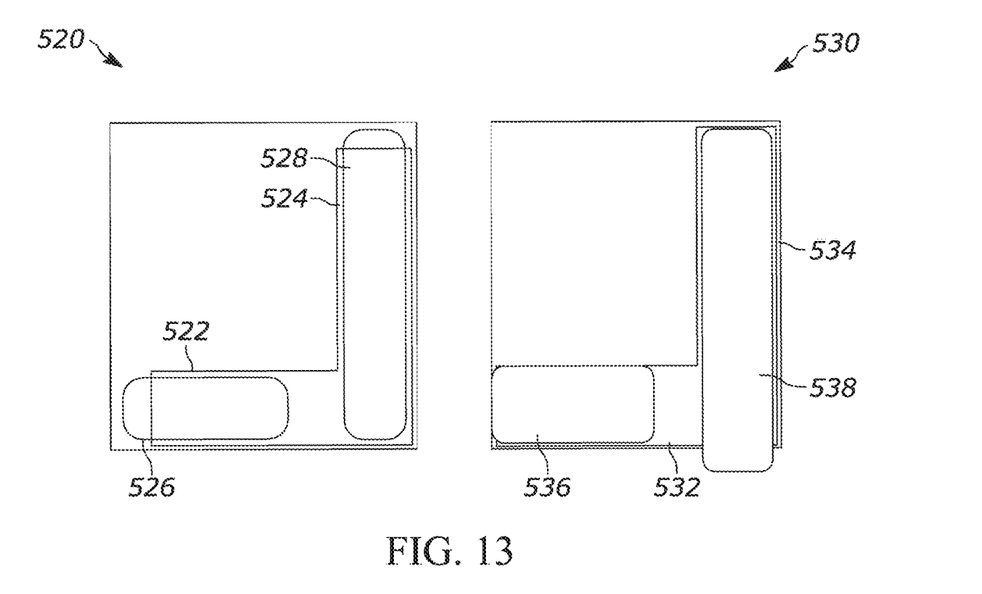
FIG. 13 is an image illustrating a higher-stress stencil aperture design and a lower-stress stencil aperture design.

FIG. 13 is an image illustrating a higher-stress stencil aperture design 520 and a lower-stress stencil aperture design 530. The higher-stress stencil aperture design 520 includes a first PCB pad 522, a second PCB pad 524, a first stencil aperture 526, and a second stencil aperture 528. The dimensions of the higher-stress stencil aperture design 520 are provided in Table 1, below. The dimensions are provided as a width and a length in millimeters (mm). The first stencil aperture 526 extends paste an edge of the first PCB pad 522 by 0.08 millimeters (mm). The second stencil aperture 528 extends paste an edge of the second PCB pad 524 by 0.05 mm.

TABLE 1

| | First PCB Pad (mm) | Second PCB Pad (mm) | First Stencil Aperture (mm) | Second Stencil Aperture (mm) |
|---|---|---|---|---|
| Higher-Stress Design | 0.20 × 0.60 | 0.20 × 0.80 | 0.18 × 0.44 | 0.18 × 0.83 |

The lower-stress stencil aperture design 530 increases the stand-off height of a surface-mount surface component (e.g., QFN package), thus increasing board level reliability (BLR). The lower-stress stencil aperture design 530 includes a first PCB pad 532, a second PCB pad 534, a first stencil aperture 536, and a second stencil aperture 538. The dimensions of the lower-stress stencil aperture design 530 are provided in Table 2, below. The dimensions are provided as a width and a length in millimeters (mm). In the lower-stress stencil aperture design 530, the first stencil aperture 536 does not extend past the first PCB pad 532 in a length direction. The second stencil aperture 538 extends past the second PCB pad 534 in a direction opposite the extension of second stencil aperture 528 of higher-stress stencil aperture design 520. In the lower-stress stencil aperture design 530, no excess solder paste is on the PCB pads 532, 534. The stand-off height of the surface-mount surface component is increased due to solder surface tension pulling back onto the PCB pads 532, 534 during the reflow process.

TABLE 2

| | First PCB Pad (mm) | Second PCB Pad (mm) | First Stencil Aperture (mm) | Second Stencil Aperture (mm) |
|---|---|---|---|---|
| Lower-Stress Design | 0.20 × 0.60 | 0.20 × 0.80 | 0.18 × 0.39 or 0.19 × 0.38 | 0.18 × 0.83 |

Figure 14:
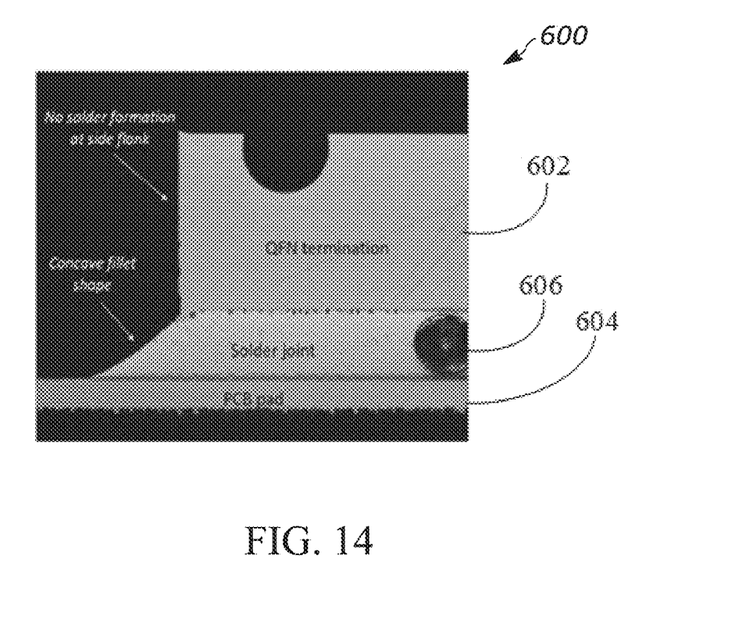
FIG. 14 is an image illustrating a cross-section of an exemplary concave solder joint.

FIG. 14 is an image illustrating a cross-section 600 of an exemplary concave solder joint 606. The concave solder joint 606 results from employing the lower-stress stencil aperture designs 410, 510 (FIG. 8; FIG. 11) to electrically connect a terminal 602 of a QFN package to a PCB pad 604. For example, solder paste is deposited on the PCB pad 604 such that the solder paste does not contact the side of the terminal and a stencil aperture is created that allows solder wicking during a reflow process. In some embodiments, the concave solder joint 606 uses a lower volume of solder paste compared to alternative solder joints (e.g., convex).

Figure 15:
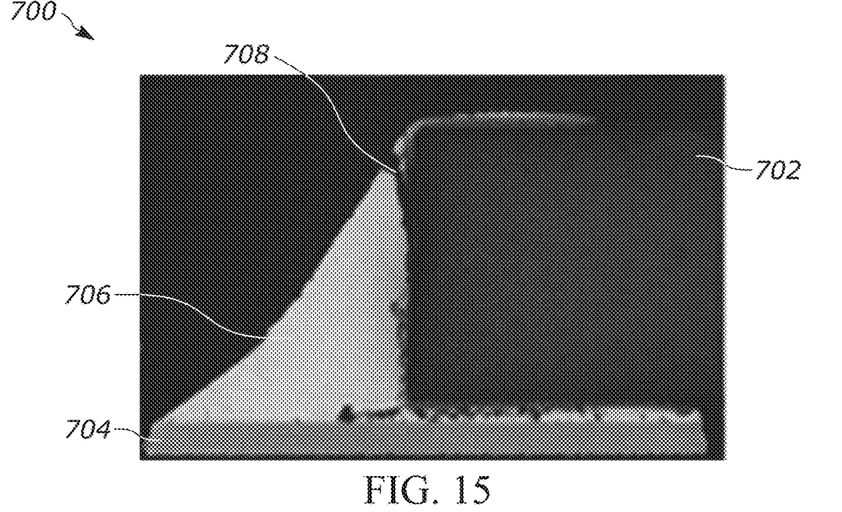
FIG. 15 is an image illustrating a cross-section of an exemplary concave solder joint.

FIG. 15 is an image illustrating a cross-section 700 of an exemplary concave solder joint 706. The cross-section 700 may be a zoomed in view of the cross-section 600 (FIG. 6). The concave solder joint 706 electrically connects a terminal 702 of a QFN Package to a PCB pad 704. The concave solder joint 706 has undergone thermal cycling, resulting in a crack 708 propagating. In some embodiments, the crack 708 appeared between 500 and 1000 thermal cycles. The crack 708 may have begun in the concave solder joint 706 section near the bottom corner of the terminal 702 and propagated in different directions. In some embodiments, the crack propagates away from the terminal 702, thus, lessening any potential determent to the electrical connection between the terminal 702 and the PCB pad 704. The crack 708 formed by the concave solder joint 706 may exert lower stress levels during thermal cycling than a crack formed by a convex solder joint. Accordingly, the crack 708 reduces a crack propagation magnitude compared to cracks formed by a convex solder joint. The crack 708 may be the result of creep deformation during thermal cycling.

Figure 16:
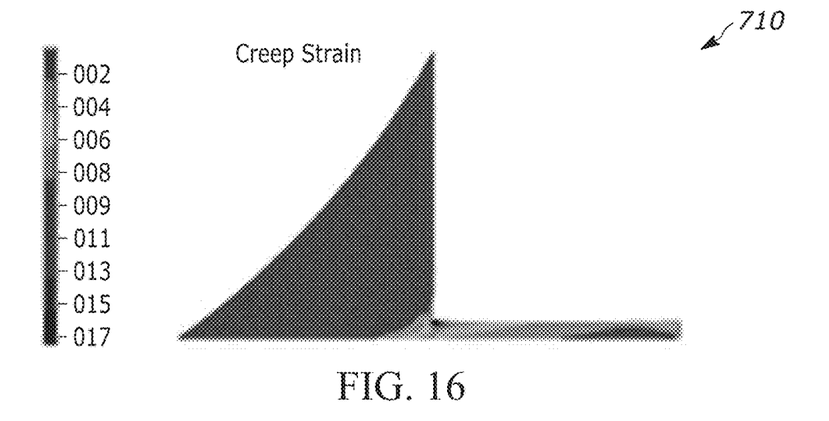
FIG. 16 is a graph illustrating an accumulated creep strain of the concave solder joint of FIG. 15.

FIG. 16 is a graph 710 illustrating an accumulated creep strain of the concave solder joint 706. The graph 710 uses data that was collected when the concave solder joint 706 underwent a temperature change of −40° C. to 100° C. The data may be collected using a finite element analysis to evaluate critical points of damage initiation. As illustrated in the graph 710, a maximum creep strain occurs at the lower corner of the concave solder joint 706, as evidenced by the light blue coloring. The location of the maximum creep strain in the graph 710 allows for a minimum strain along a side surface of the terminal 702. Creep is a time-dependent deformation when a material is subjected to a stress for a prolong period of time.

Figure 17:
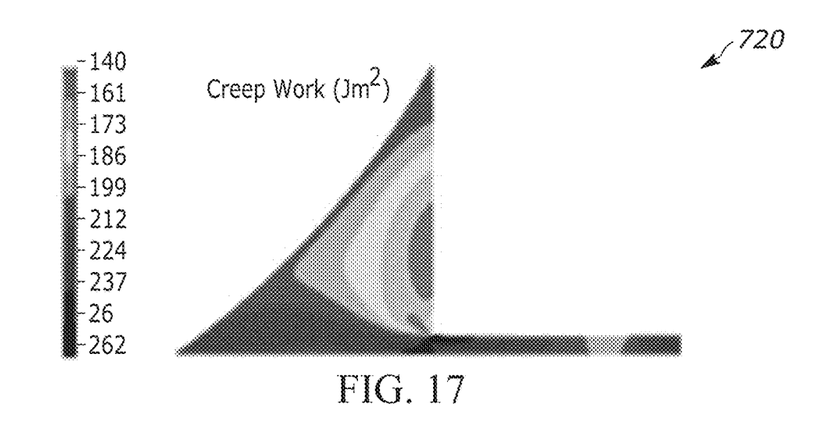
FIG. 17 is a graph illustrating creep work in the concave solder joint of FIG. 15.

FIG. 17 is a graph illustrating creep work in the concave solder joint 706. The graph 720 uses data that was collected when the concave solder joint 706 underwent a temperature change of −40° C. to 100° C. The data may be collected using a finite element analysis to evaluate critical points of damage initiation. As illustrated in the graph 720, the creep work is at a maximum at the lower corner of the concave solder joint 706, as evidenced by the red and yellow coloring. Along the side surface of the terminal 702, the creep work is at a minimum, as evidenced by the dark blue coloring.

Figure 18:
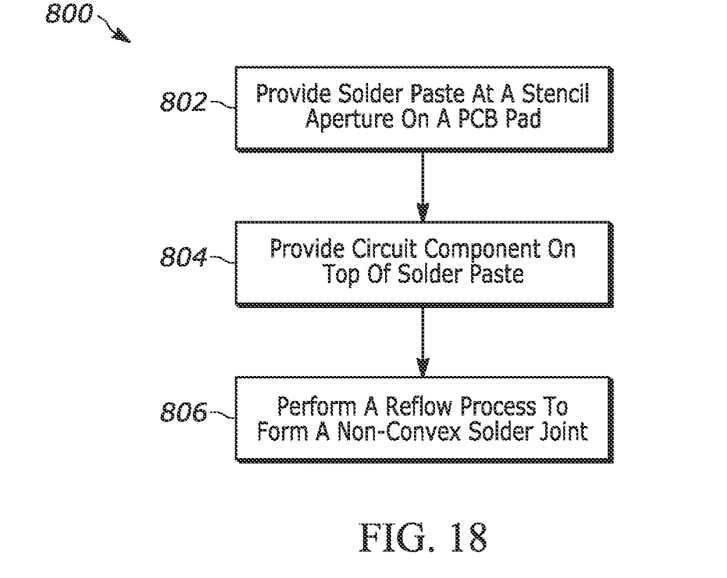
FIG. 18 is a flowchart method for creating a concave solder joint, in accordance with some embodiments of the disclosure.

FIG. 18 is a flowchart method 800 for creating a concave solder joint, in accordance with some embodiments of the disclosure. The method 800 includes providing a solder paste to a PCB pad (at block 802). In some embodiments, the PCB pad is an exposed area of a stencil aperture. In some embodiments, the PCB pad is a first predetermined area and the stencil aperture is a second predetermined area that is less than the first predetermined area.

The method 800 includes providing a circuit component on top of the solder paste (at block 804). In some embodiments, the circuit component is a QFN package with terminals that are the same area on the bottom as the solder paste. Alternatively, in some embodiments, the circuit component is any surface-mounted circuit component.

The method 800 also includes performing a reflow process to form a non-convex solder joint (at block 806). In some embodiments, during the reflow process, the solder wicks and forms a concaved solder joint. The concaved solder joint provides an electrical connection between the terminal of the QFN package and the PCB pad.

The following are enumerated examples of methods, stencils, and electronic devices described herein. Example 1: a method of assembling an electronic device using a stencil, the method comprising: depositing a solder paste at a plurality of stencil apertures on a printed circuit board (PCB) pad, wherein the PCB pad has a first predefined area and one stencil aperture of the plurality of stencil apertures has an aperture wall defining a second predefined area that is less than or equal to the first predefined area; providing a surface mount circuit component on top of the solder paste, wherein the surface mount circuit component includes at least one terminal with a non-solderable side surface; and performing a reflow process to form a non-convex solder joint between the at least one terminal and the PCB pad.

Example 2: the method of Example 1, wherein the solder paste has a first side surface and the at least one terminal has a second side surface that is substantially parallel to the first side surface, and wherein, prior to performing the reflow process, the first side surface and the second side surface combine to form a combined side surface in a first direction.

Example 3: the method of any of Examples 1 or 2, wherein the non-convex solder joint is a concave solder joint.

Example 4: The method of any of Examples 1 or 3, wherein the non-convex solder joint is a straight solder joint.

Example 5: The method of any of Examples 1 through 4, wherein the surface mount circuit component is a quad flat no-lead (QFN) package.

Example 6: The method of any of Examples 1 through 5, wherein the PCB pad is a copper material.

Example 7: The method of any of Examples 1 through 6, wherein a maximum principal stress level exerted by the non-convex solder joint is less than or equal to 42 megapascal (MPa).

Example 8: The method of Example 7, wherein the maximum principal stress level exerted by a concave solder joint is approximately equal to 30 MPa.

Example 9: The method of any of Examples 1 through 8, wherein a width of the solder paste is 0.2 millimeters (mm) prior to the reflow process.

Example 10: A stencil for depositing solder on a printed circuit board (PCB), the stencil comprising: a plurality of stencil apertures, a first stencil aperture of the plurality of stencil apertures having an aperture wall defining an aperture perimeter, wherein the aperture wall is configured to not extend beyond an outer edge of a PCB pad provided on the PCB, wherein the aperture wall is configured to not extend beyond an outer edge of a terminal of a surface mount component, and wherein the first stencil aperture is configured to receive solder paste to form a non-convex solder joint between the PCB pad and the terminal.

Example 11: The stencil of Example 10, wherein the non-convex solder joint is a concave solder joint.

Example 12: The stencil of Example 10, wherein the non-convex solder joint is a straight solder joint.

Example 13: The stencil of any of Examples 10 through 12, wherein a maximum principal stress level exerted by the non-convex solder joint is less than or equal to 42 megapascal (MPa).

Example 14: The stencil of Example 13, wherein the non-convex solder joint is a concave solder joint, wherein the maximum principal stress level exerted by the concave solder joint is approximately equal to 30 MPa.

Example 15: The stencil of any of Examples 10 through 14, wherein a portion of the aperture perimeter defined by the aperture wall has a width of approximately 0.2 millimeters (mm).

Example 16: The stencil of any of Examples 10 through 15, wherein the surface mount component is a quad flat no-lead (QFN) package.

Example 17: The stencil of any of Examples 10 through 16, wherein the first stencil aperture is configured to receive the solder paste that contacts the PCB pad and only a surface of the terminal that faces the PCB pad.

Example 18: An electronic device assembled using a stencil, the electronic device comprising: a printed circuit board (PCB) including a substrate defining a plurality of PCB pads with a first predefined area; a surface mount circuit component including at least one terminal; and a non-convex solder joint between the at least one terminal and one of the plurality of PCB pads.

Example 19: The electronic device of Example 18, wherein the non-convex solder joint is a concave solder joint.

Example 20: The electronic device of any of Examples 18 or 19, wherein the non-convex solder joint contacts the one of the plurality of PCB pads and contacts only a surface of the at least one terminal that faces the one of the plurality of PCB pads.

Example 21: The electronic device of Example 18, wherein the non-convex solder joint is a straight solder joint.

Example 22: The electronic device of any of Examples 18 through 21, wherein the surface mount circuit component is a quad flat no-lead (QFN) package.

Example 23: The electronic device of any of Examples 18 through 22, wherein the substrate is a copper material.

Example 24: The electronic device of any of Examples 18 through 23, wherein a maximum principal stress level exerted by the non-convex solder joint is less than or equal to 42 megapascal (MPa).

Example 25: The electronic device of Example 24, wherein the maximum principal stress level exerted by a concave solder joint is approximately equal to 30 MPa.

Example 26: The electronic device of any of Examples 18 through 25, wherein a creep strain of the non-convex solder joint is at a maximum at a bottom corner of the at least one terminal.

Example 27: The electronic device of any of Examples 18 through 26, wherein a width of the solder paste is 0.2 millimeters (mm).

Example 28: The electronic device of any of Examples 18 through 28, wherein the non-convex solder joint is formed after a reflow process is performed on the electronic device.

In the above description, numerous details are set forth, such as providing a stencil aperture for solder paste to exclusively contact of a portion of a terminal that is parallel to the a PCB board of a surface-mount component prior to a reflow process and allowing for wicking of the solder paste to form a non-convex solder joint, and the like, in order to provide an understanding of one or more aspects of the present disclosure. It will be readily apparent to one skilled in the art that these specific details are merely exemplary and not intended to limit the scope of this application. This description is intended solely to give a general idea of various aspects of the disclosure and does not limit the scope of the disclosure in any way.

Accordingly, it is to be understood that the above description is intended to be illustrative and not restrictive. Many embodiments and applications other than the examples provided would be apparent upon reading the above description. The scope should be determined, not with reference to the above description, but should instead be determined with reference to the appended claims, along with the full scope of equivalents to which such claims are entitled. It is anticipated and intended that future developments will occur in the technologies discussed herein, and that the disclosed systems and methods will be incorporated into such future embodiments. In sum, it should be understood that the application is capable of modification and variation.

All terms used in the claims are intended to be given their broadest reasonable constructions and their ordinary meanings as understood by those knowledgeable in the technologies described herein unless an explicit indication to the contrary in made herein. In particular, use of the singular articles such as "a," "the," "said," etc. should be read to recite one or more of the indicated elements unless a claim recites an explicit limitation to the contrary.

The Abstract is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus, the following claim is hereby incorporated into the Detailed Description and standing on its own as a separately claimed subject matter.

What is claimed is:

1. A method of assembling an electronic device using a stencil, the method comprising:
   depositing a solder paste at a plurality of stencil apertures on a printed circuit board (PCB) pad, wherein the PCB pad has a first predefined area and one stencil aperture of the plurality of stencil apertures has an aperture wall defining a second predefined area that is less than or equal to the first predefined area;
   providing a surface mount circuit component on top of the solder paste, wherein the surface mount circuit component includes at least one terminal with a non-solderable side surface; and
   performing a reflow process to form a non-convex solder joint between the at least one terminal and the PCB pad.

2. The method of claim 1, wherein the solder paste has a first side surface and the at least one terminal has a second side surface that is substantially parallel to the first side surface, and
   wherein, prior to performing the reflow process, the first side surface and the second side surface combine to form a combined side surface in a first direction.

3. The method of claim 1, wherein the non-convex solder joint is a concave solder joint.

4. The method of claim 1, wherein the non-convex solder joint is a straight solder joint.

5. The method of claim 1, wherein the surface mount circuit component is a quad flat no-lead (QFN) package.

6. The method of claim 1, wherein the PCB pad is a copper material.

7. The method of claim 1, wherein a maximum principal stress level exerted by the non-convex solder joint is less than or equal to 42 megapascal (MPa).

8. The method of claim 7, wherein the maximum principal stress level exerted by a concave solder joint is approximately equal to 30 MPa.

9. The method of claim 1, wherein a width of the solder paste is 0.2 millimeters (mm) prior to the reflow process.

* * * * *